(12) United States Patent
Chen

(10) Patent No.: US 12,125,714 B2
(45) Date of Patent: Oct. 22, 2024

(54) METHODS FOR FORMING TRENCH STRUCTURES IN SUBSTRATES

(71) Applicant: Applied Materials, Inc., Santa Clara, CA (US)

(72) Inventor: Taichou Papo Chen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/736,182

(22) Filed: May 4, 2022

(65) Prior Publication Data

US 2023/0230848 A1 Jul. 20, 2023

(30) Foreign Application Priority Data

Jan. 20, 2022 (WO) ................ PCT/US2022/013043

(51) Int. Cl.
*H01L 21/322* (2006.01)
(52) U.S. Cl.
CPC .................................. *H01L 21/322* (2013.01)
(58) Field of Classification Search
CPC . H01L 21/322; H01L 21/76829–76834; H01L 21/76822–76828; H01L 21/76898; H01L 21/3115–31155; H01L 21/223; H01L 21/2254; H01L 21/2257; H01L 21/28238
See application file for complete search history.

(56) References Cited

U.S. PATENT DOCUMENTS

| 6,287,988 B1* | 9/2001 | Nagamine ......... H01L 21/31662 257/E21.546 |
| 8,470,684 B2 | 6/2013 | Pei et al. |
| 8,502,308 B2 | 8/2013 | Schrems et al. |
| 10,546,937 B2 | 1/2020 | Singh et al. |
| 2004/0082116 A1* | 4/2004 | Kub ...................... H01L 29/872 438/137 |
| 2005/0082549 A1* | 4/2005 | Lee ....................... H01L 31/107 257/E31.128 |
| 2012/0309151 A1 | 12/2012 | Zhang et al. |
| 2016/0079288 A1 | 3/2016 | Choi et al. |

(Continued)

FOREIGN PATENT DOCUMENTS

| KR | 10-1605363 A1 | 3/2016 |
| KR | 10-2190137 B1 | 12/2020 |

OTHER PUBLICATIONS

PCT International Search Report and Written Opinion for PCT/US2022/013043 dated Oct. 14, 2022.

*Primary Examiner* — Karen Kusumakar
*Assistant Examiner* — Adam S Bowen
(74) *Attorney, Agent, or Firm* — MOSER TABOADA

(57) ABSTRACT

Methods for forming a trench structure with passivated surfaces. In some embodiments, a method of forming a trench structure may include etching a trench into a substrate material of the substrate, forming an oxide layer on surfaces of the trench using a dry oxide process at a temperature of less than approximately 450 degrees Celsius, selectively removing the oxide layer from surfaces of the trench, and forming a passivation layer on surfaces of the trench to form a homogeneous passivation region as part of the substrate material using a low temperature process of less than approximately 450 degrees Celsius.

20 Claims, 5 Drawing Sheets

(56) References Cited

U.S. PATENT DOCUMENTS

2018/0190817 A1* 7/2018 Wu .................... H01L 29/42392
2020/0243582 A1* 7/2020 Li ..................... H01L 21/76224
2022/0352028 A1* 11/2022 Monge Roffarello ......................
                                                      H01L 21/324

* cited by examiner

METHODS FOR FORMING TRENCH STRUCTURES IN SUBSTRATES

CROSS-REFERENCE TO RELATED APPLICATIONS

This application claims priority to International Patent Application No. PCT/US2022/013043, filed Jan. 20, 2022, and entitled "METHODS FOR FORMING TRENCH STRUCTURES IN SUBSTRATES," the contents of which are hereby incorporated by reference in its entirety.

FIELD

Embodiments of the present principles generally relate to semiconductor processing of semiconductor substrates.

BACKGROUND

For semiconductor devices, trenches are often created in a substrate as part of structure. During the formation of the trenches, the walls or surfaces of the trenches are often damaged by the etching processes. The damaged trench surfaces reduce the performance of devices that utilize the trench. The inventor has found that traditional processes are limited in that the trench surfaces are often left with damage and contaminants even after precleaning processes have been performed. The damaged surfaces cause increased defect densities and lower charge mobilities in devices such as optoelectronic devices.

Accordingly, the inventor has provided improved processes for repairing damaged trench surfaces that substantially reduce performance penalties caused by poorly passivated surfaces.

SUMMARY

Methods and structures for improved trench structures are provided herein.

In some embodiments, a method of forming a trench structure in a substrate may comprise etching a trench into a substrate material of the substrate, forming an oxide layer on surfaces of the trench using a dry oxide process, selectively removing the oxide layer from surfaces of the trench, and forming a passivation layer on surfaces of the trench to form a homogeneous passivation region as part of the substrate material.

In some embodiments, the method may further comprise wherein the passivation layer is an epitaxial layer formed of single crystals with or without dopant species for charge formation, wherein the passivation layer is a polymorphous layer with or without dopant species for charge formation, forming the passivation layer using a low temperature process of less than approximately 450 degrees Celsius, wherein the dry oxide process has a controllable oxidation thickness of approximately 1 nm to approximately 15 nm, wherein the dry oxide process is performed in a plasma oxidation chamber, wherein the dry oxide process is performed at a temperature of less than approximately 450 degrees Celsius, etching the trench to a high aspect ratio of greater than approximately 75:1, wherein the oxide layer has at least a 95% conformality on surfaces of the trench for high aspect ratios of greater than approximately 100:1, and/or wherein selectively removing the oxide layer is accomplished with a selectivity of oxide to the substrate material of greater than 50:1.

In some embodiments, a method of forming a trench structure in a substrate may comprise etching a trench with a high aspect ratio into a substrate material, repairing surfaces of the trench from damage caused by etching of the trench, growing an epitaxial layer on surfaces of the trench to form a homogeneous passivation region as part of the substrate material, doping the epitaxial layer with an additional dopant to engineer a passivation charge region, and performing a charge diffusion process to embed the additional dopant into the substrate material.

In some embodiments, the method may further comprise wherein the homogeneous passivation region is formed by single crystal epitaxial growth or by oxidizing non-crystal doped material, etching the trench to the high aspect ratio greater than approximately 75:1, repairing surfaces of the deep trench by: forming a dry oxide layer on surfaces of the trench and selectively removing the dry oxide layer from surfaces of the trench, wherein forming the dry oxide layer is a process with a controllable oxidation thickness of approximately 1 nm to approximately 15 nm, wherein the dry oxide layer is formed in a plasma oxidation chamber, wherein the dry oxide layer has at least a 95% conformality on surfaces of the trench for high aspect ratios of greater than approximately 100:1, and/or wherein selectively removing the dry oxide layer is accomplished with a selectivity of oxide to the substrate material of greater than 50:1.

In some embodiments, a non-transitory, computer readable medium having instructions stored thereon that, when executed, cause a method for forming a trench structure in a substrate to be performed, the method may comprise etching a trench into a substrate material of the substrate, forming an oxide layer on surfaces of the trench using a dry oxide process, selectively removing the oxide layer from surfaces of the trench, and forming a passivation layer on surfaces of the trench to form a homogeneous passivation region as part of the substrate material.

In some embodiments, the method of the computer readable medium may further comprise etching the trench to a high aspect ratio of greater than approximately 75:1, wherein the oxide layer has at least a 95% conformality on surfaces of the trench for high aspect ratios of greater than approximately 100:1, and/or wherein selectively removing the oxide layer is accomplished with a selectivity of oxide to the substrate material of greater than 50:1.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
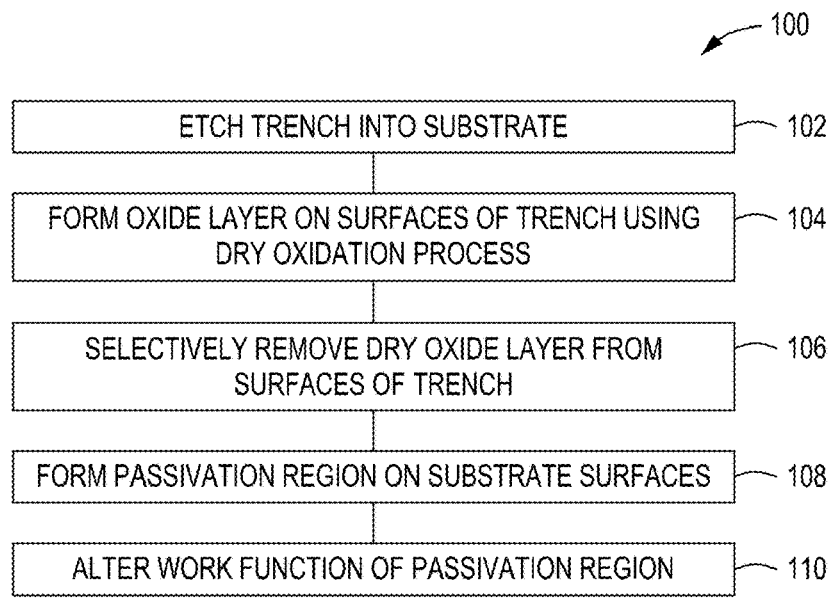
FIG. 1 is a method of forming a trench structure in a substrate in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide a high-performance trench formation solution that dramatically decreases the damage found in traditionally formed trenches such as etching related crystal damage and chemical mechanical polishing (CMP) related crystal damage. Surface defects that severely impact performance causing noise generation and device leakage can be minimized. In addition, the trench formation of the present principles utilizes homogeneous film properties to reduce dangling bonds of the trench surfaces without adding an additional material interface to the trench. A homogeneous layer also has the advantage of no optical penalty versus a heterogeneous layer with high optical penalty when trenches are used for optoelectronics and the like. A further benefit is that damage free trench structures may be formed using low thermal budgets of less than 450 degrees Celsius. The methods of the present principles also have the advantage of allowing a greater degree of damage thickness to be repaired such as approximately 1 nm to approximately 15 nm or more compared to traditional techniques which are limited to 1 nm to 2 nm in thickness. Damage can also be repaired on low aspect ratio trenches to high aspect ratio trenches of greater than 100:1 using the present techniques.

Figure 2A:
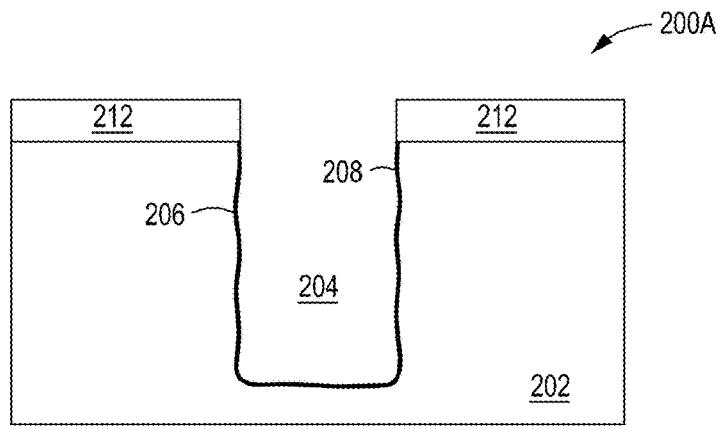
FIG. 2A depicts a cross-sectional view of a trench after an etching process in accordance with some embodiments of the present principles.

Although a trench is used for the sake of brevity in the following examples, other structures may benefit from the methods of the present principles and, therefore, the use of a trench in the examples is not meant to be limiting. For example, the techniques of the present principles may also be used for planar structures as well. FIG. 1 is a method 100 of forming a trench 204 in a substrate 202 in accordance with some embodiments. In block 102, an etching process forms a trench 204 into the substrate 202 as depicted in view 200A of FIG. 2A. The etching process typically uses a hardmask layer 212 that protects areas from the etching process. In some embodiments, the aspect ratio of the trench 204 is at least approximately 50:1. In some embodiments, the aspect ratio of the trench 204 is at least approximately 75:1. In some embodiments, the aspect ratio of the trench 204 is at least approximately 100:1. As a side effect of the etching process, damage 208 occurs to the surfaces 206 of the trench 204. The damage 208 may include crystal damage of the substrate material, contaminants or residue from the etching process, and/or dangling bonds of the substrate material and the like. The hardmask layer 212 is removed after the etching process is completed.

Figure 2B:
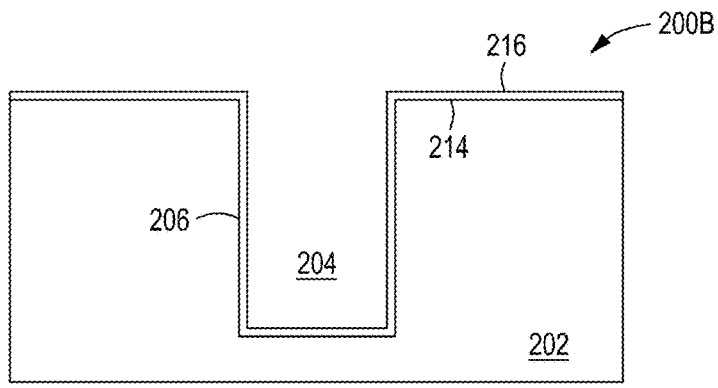
FIG. 2B depicts a cross-sectional view of a trench after a dry oxide process in accordance with some embodiments of the present principles.

In block 104, an oxide layer 216 is formed on the substrate 202 using a dry oxidation process. As depicted in a view 200B of FIG. 2B, the field 214 or top surfaces of the substrate 202 and the surfaces 206 of the trench 204 undergo a dry oxidation process to form an oxide layer 216 that partially consumes the material of the substrate 202 including damaged portions. The dry oxidation process can be performed at temperatures of less than 450 degrees Celsius and produce less contamination and residue when compared to wet oxidation processes. In addition, dry oxidation processes can be used in substantially higher aspect ratio structures (e.g., greater than 100:1 aspect ratios) than wet oxidation (e.g., less than 50:1 aspect ratios). In some embodiments, the dry oxidation process is performed with a plasma oxidation chamber with or without a remote plasma source. The dry oxidation process facilitates in embedding oxygen into the surfaces 206 of the trench 204 to repair damage to the surfaces 206 and reduce stress induced leakage current (SILC) and interface trap densities ($D_{it}$).

The dry oxidation process can also be controlled to provide different thicknesses of the oxide layer 216. Parameters such as exposure time, plasma density, temperature and the like can facilitate in determining an oxidation rate. The thickness is then controlled by the duration of the dry oxidation process. In conventional methods such as wet oxidation, the oxidizing process is self-limiting (wet oxidation process is self-terminating) and oxide layer thicknesses cannot be adjusted. Wet oxidation typically stops at 1 nm to 2 nm of thickness at the saturation point. Dry oxidation does not have a saturation point and is not self-limiting allowing any level of thickness to be obtained. In some embodiments, the dry oxidation processes can achieve conformality in the trench 204 of greater than 95% for trenches with an aspect ratio of greater than 100:1, enabling scaling of trench isolation structures using the present principles.

Figure 2C:
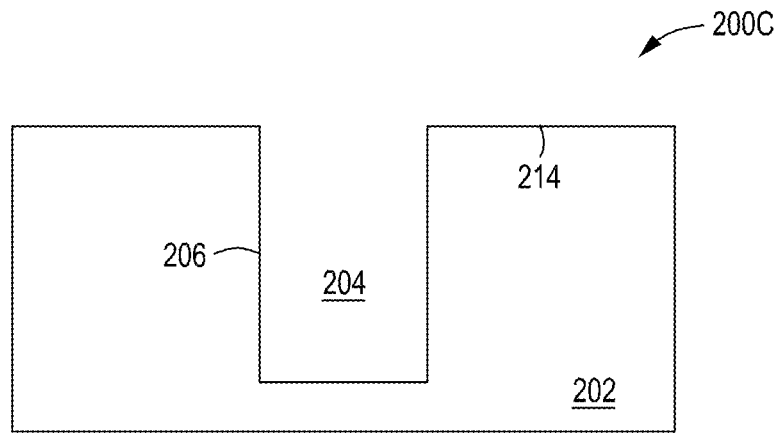
FIG. 2C depicts a cross-sectional view of a trench after a selective oxide removal process in accordance with some embodiments of the present principles.

In block 106, the oxide layer 216 is selectively removed from the surfaces 206 of the trench 204 and the field 214 of the substrate 202 as depicted in a view 200C of FIG. 2C. In some embodiments, plasma-based chambers can be used to selectively remove the oxide layer 216 with selectivity ratios of, for example, greater than 50:1 (e.g., oxide over Si or SiGe). The selective removal of the oxide layer 216 removes all of the oxide layer 216 without damaging any of the underlying material of the substrate 202 or creating contaminants/residue, leaving damage free surfaces of the trench 204.

Figure 2D:
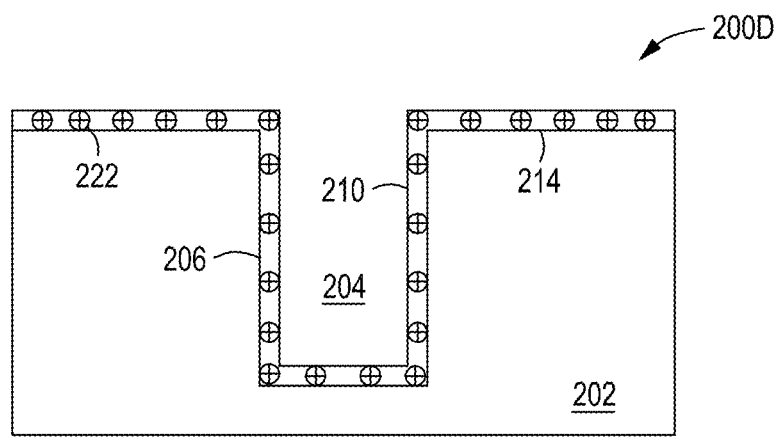
FIG. 2D depicts a cross-sectional view of a trench after a forming a passivation region in accordance with some embodiments of the present principles.
Figure 4A:
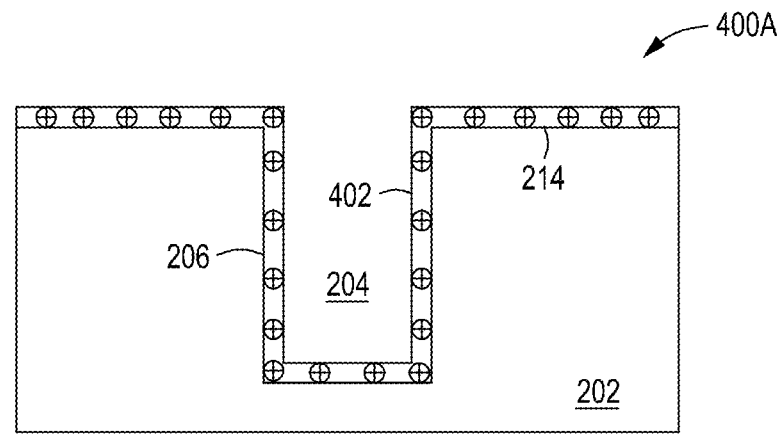
FIG. 4A depicts a first process of a second approach in accordance with some embodiments of the present principles.
Figure 4B:
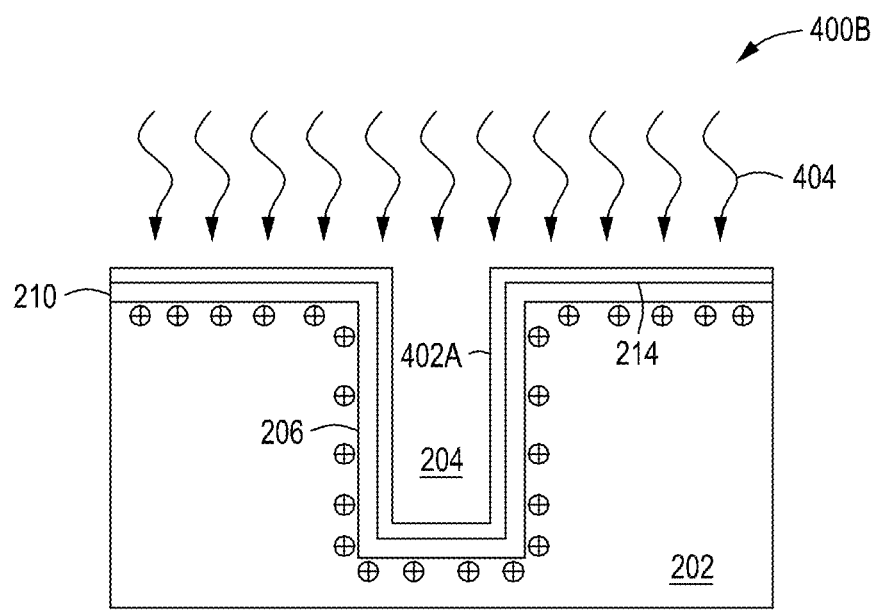
FIG. 4B depicts a second process of a second approach in accordance with some embodiments of the present principles.

In block 108, a passivation region 210 is formed on the surfaces 206 of the substrate 202 including surfaces of the trench 204 and/or surfaces of the field 214 of the substrate 202 as depicted in a view 200D of FIG. 2D. In some embodiments, the passivation region 210 is formed of homogeneous material similar to the material of the substrate 202. The passivation region 210 is formed by single crystals of the material with a species of dopants 222 (P-type species shown but not meant to be limiting) incorporated to form a positive charge or a negative charge (e.g., silicon doped with boron, gallium, phosphor, arsenic, etc.) on the substrate 202 and can be fabricated by two approaches. The first approach is with a low temperature epitaxial growth process using temperatures of less than approximately 450 degrees Celsius. The second approach is a two-part process in which the first part is to form a non-crystal doped material layer 402 on the field 214 as depicted in a view 400A of FIG. 4A followed by a second part including a material engineering process such as oxidation or thermal treatment 404 to drive dopant diffuse from the non-crystal doped material layer 402 into substrate 202 surface as depicted in a view 400B of FIG. 4B. The non-crystal doped material layer 402 becomes an oxide layer 402A. The passivation region 210 is formed as single crystal material under the field 214.

In essence, the single crystal homogeneous layer becomes part of or an extension of the substrate material and does not form an interface between the passivation region 210 and the substrate 202, eliminating an interface commonly found in conventional processes that form a heterogeneous passivation region. The passivation region 210 also does not have any optical penalty as photons pass through the passivation region 210 as the photons would through the material of the substrate 202 without any degradation or change in path (refraction). The formation of the homogeneous passivation region also serves in repairing dangling bonds of the surfaces 206 of the trench 204 caused during trench etching processes. In some embodiments, the portion of the passivation region 210 on the field 214 of the substrate 202 may be removed, leaving only the portion of the passivation region 210 in the trench 204. In some embodiments, the passivation region 210 can also be heterogeneous material incorporating species such as Ge, carbon, for the engineering of energy band, light sensitivity, etc. and with gradient transition from the material of the substrate 202 to the passivation region 210 without any interface formation in between.

Figure 2E:
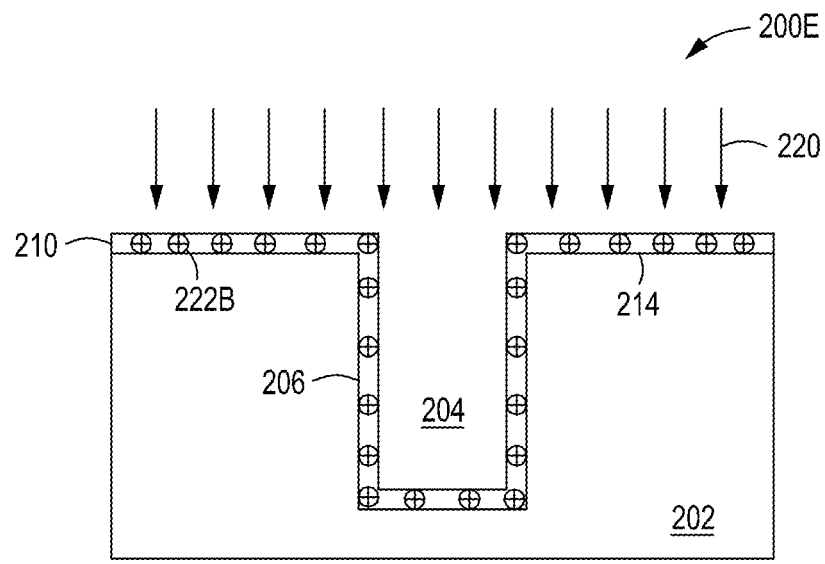
FIG. 2E depicts a cross-sectional view of a trench after an optional gas doping process of the passivation region in accordance with some embodiments of the present principles.

Optionally, in some embodiments, the passivation region 210 may be formed without dopants which are then introduced via gases 220 as depicted in a view 200E of FIG. 2E. In further optional embodiments, the passivation region 210 may be formed with dopants and then enhanced with additional dopants by exposure to gases. The substrate 202 is exposed to gases 220 including dopants 222B that embed in the passivation region 210 on the field 214 of the substrate 202 and the surfaces 206 of the trench 204. The dopants 222B (as shown) in FIG. 2E have a positive charge for the sake of brevity and is not meant to be limiting. The dopants 222B may also have a negative charge (not shown). Gases 220 can also incorporate species such as Ge, carbon, for material engineering purposes on composition, energy band, light sensitivity, etc. The density of the dopants 222B and/or the type of the dopants 222B may be adjusted to provide a given plus or minus charge level as required for the trench 204.

Figure 2F:
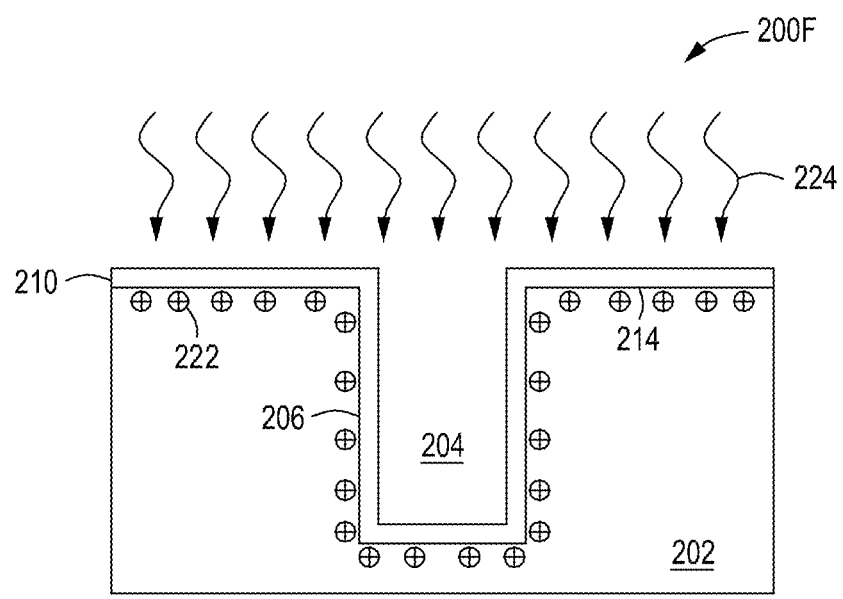
FIG. 2F depicts a cross-sectional view of a trench after a work function is altered in accordance with some embodiments of the present principles.

In block 110, a work function of the passivation region 210 can be altered as depicted in a view 200F of FIG. 2F. The dopants 222 are further embedded into the material of the substrate 202 by a dopant diffusion process 224. In some embodiments, the dopant diffusion process 224 may be a millisecond anneal process that uses high power and high temperature lasers (e.g., 700 degrees Celsius to 900 degrees Celsius) that are pulsed in the millisecond range to anneal the substrate 202 without heating the substrate to high temperatures. In some embodiments, the dopant diffusion process 224 could be an oxidation process in which dopant or composition diffusion from the passivation region 210 into the substrate 202 occurs upon changing the material composition of the passivation region 210 to oxide. The process is the same method as the second approach mentioned in block 108 for the passivation region 210 formation and can be combined. The dopant diffusion process 224 yields an abrupt charge boundary in the material of the substrate 202 that increases the effective area of an adjacent device as opposed to conventional techniques that form a large region of gradient charge. In some embodiments, the abrupt charge boundary or abrupt charge passivation region has a charge formation of plus or minus approximately $3e18/cm^3$ to approximately $3e21/cm^3$.

Figure 3:
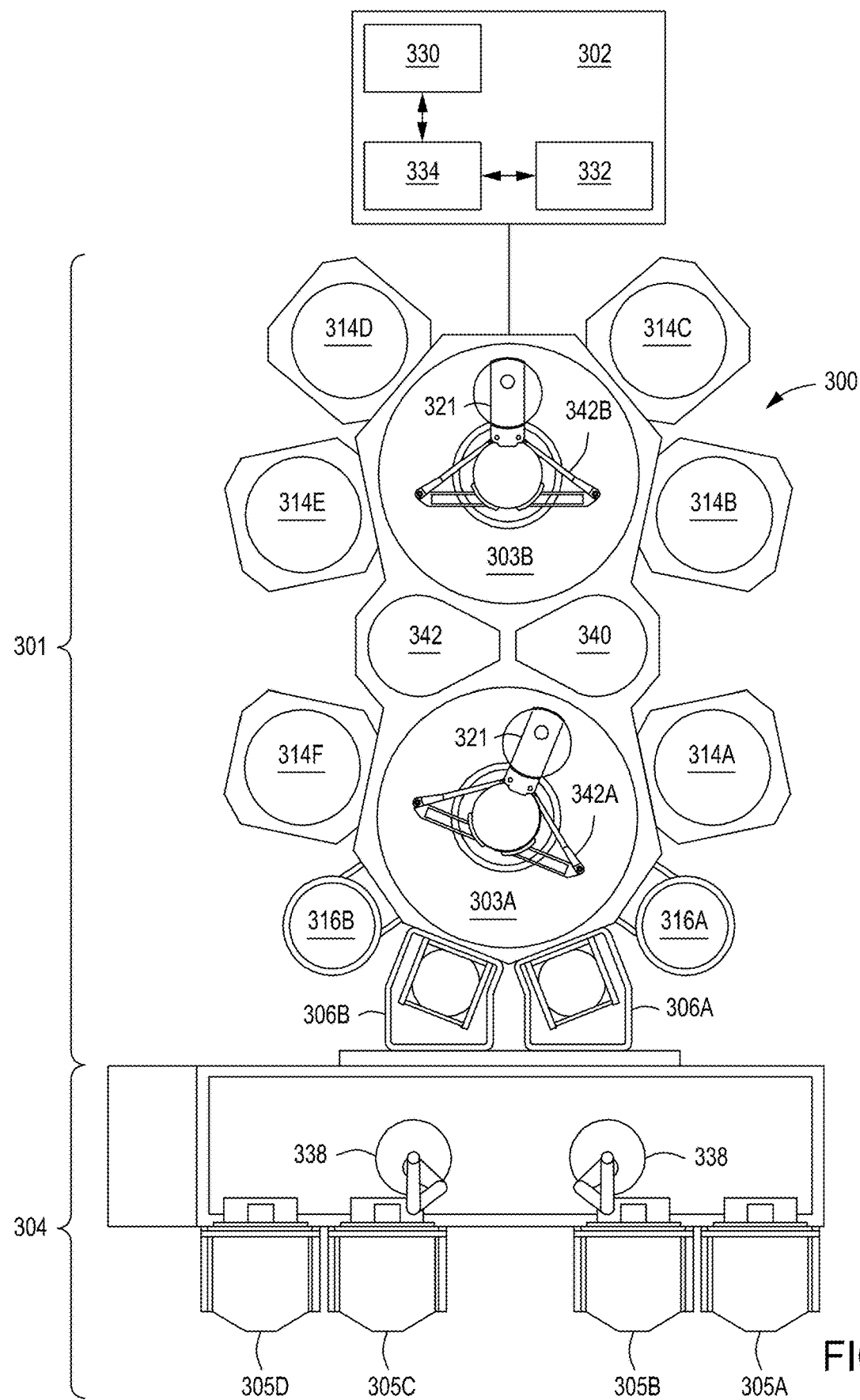
FIG. 3 depicts an integrated tool in accordance with some embodiments of the present principles.

The methods described herein may be performed in individual process chambers that may be provided in a standalone configuration or as part of a cluster tool, for example, an integrated tool 300 (i.e., cluster tool) described below with respect to FIG. 3. The advantage of using an integrated tool 300 is that there is no vacuum break and, therefore, no requirement to degas and pre-clean a substrate before treatment in a chamber. For example, in some embodiments the inventive methods discussed above may advantageously be performed in an integrated tool such that there are limited or no vacuum breaks between processes, limiting or preventing contamination of the substrate. The integrated tool 300 includes a vacuum-tight processing platform 301, a factory interface 304, and a system controller 302. The processing platform 301 comprises multiple processing chambers, such as 314A, 313B, 314C, 314D, 314E, and 314F operatively coupled to a vacuum substrate transfer chamber (transfer chambers 303A, 303B). The factory interface 304 is operatively coupled to the transfer chamber 303A by one or more load lock chambers (two load lock chambers, such as 306A and 306B shown in FIG. 3).

In some embodiments, the factory interface 304 comprises at least one docking station 307, at least one factory interface robot 338 to facilitate the transfer of the semiconductor substrates. The docking station 307 is configured to accept one or more front opening unified pod (FOUP). Four FOUPS, such as 305A, 305B, 305C, and 305D are shown in the embodiment of FIG. 3. The factory interface robot 338 is configured to transfer the substrates from the factory interface 304 to the processing platform 301 through the load lock chambers, such as 306A and 306B. Each of the load lock chambers 306A and 306B have a first port coupled to the factory interface 304 and a second port coupled to the transfer chamber 303A. The load lock chamber 306A and 306B are coupled to a pressure control system (not shown) which pumps down and vents the load lock chambers 306A and 306B to facilitate passing the substrates between the vacuum environment of the transfer chamber 303A and the substantially ambient (e.g., atmospheric) environment of the factory interface 304. The transfer chambers 303A, 303B have vacuum robots 342A, 342B disposed in the respective transfer chambers 303A, 303B. The vacuum robot 342A is capable of transferring substrates 321 between the load lock chamber 306A, 306B, the processing chambers 314A and 314F and a cooldown station 340 or a pre-clean station 342. The vacuum robot 342B is capable of transferring substrates 321 between the cooldown station 340 or pre-clean station 342 and the processing chambers 314B, 314C, 314D, and 314E.

In some embodiments, the processing chambers 314A, 314B, 314C, 314D, 314E, and 314F are coupled to the transfer chambers 303A, 303B. The processing chambers 314A, 314B, 314C, 314D, 314E, and 314F may comprise, for example, an atomic layer deposition (ALD) process chamber, a physical vapor deposition (PVD) process chamber, chemical vapor deposition (CVD) chambers, annealing chambers, or the like. The chambers may include any chambers suitable to perform all or portions of the methods described herein, as discussed above, such as a dry oxide removal chamber or pre-clean chamber and an epitaxial growth chamber along with etching and deposition chambers. In some embodiments, one or more optional service chambers (shown as 316A and 316B) may be coupled to the transfer chamber 303A. The service chambers 316A and 316B may be configured to perform other substrate processes, such as degassing, orientation, substrate metrology, cool down and the like.

The system controller 302 controls the operation of the tool 300 using a direct control of the process chambers 314A, 314B, 314C, 314D, 314E, and 314F or alternatively, by controlling the computers (or controllers) associated with the process chambers 314A, 314B, 314C, 314D, 314E, and 314F and the tool 300. In operation, the system controller 302 enables data collection and feedback from the respective chambers and systems to optimize performance of the tool 300. The system controller 302 generally includes a Central Processing Unit (CPU) 330, a memory 334, and a support circuit 332. The CPU 330 may be any form of a general-purpose computer processor that can be used in an industrial setting. The support circuit 332 is conventionally coupled to the CPU 330 and may comprise a cache, clock circuits, input/output subsystems, power supplies, and the like. Software routines, such as a method as described above may be stored in the memory 334 and, when executed by the CPU 330, transform the CPU 330 into a specific purpose computer (system controller) 302. The software routines may also be stored and/or executed by a second controller (not shown) that is located remotely from the tool 300.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of forming a trench structure in a substrate, comprising:
    etching a trench into a substrate material of the substrate, wherein the trench has a high aspect ratio of greater than approximately 75:1;
    forming an oxide layer directly on surfaces of the trench using a dry oxide process;
    selectively removing the oxide layer from surfaces of the trench, wherein selectively removing the oxide layer is accomplished with a selectivity of oxide to the substrate material of greater than 50:1; and
    forming a passivation layer on surfaces of the trench to form a homogeneous passivation region as part of the substrate material.

2. The method of claim 1, wherein the passivation layer is an epitaxial layer formed of single crystals with or without dopant species for charge formation.

3. The method of claim 1, wherein the passivation layer is a polymorphous layer with or without dopant species for charge formation.

4. The method of claim 1, further comprising:
    forming the passivation layer using a low temperature process of less than approximately 450 degrees Celsius.

5. The method of claim 1, wherein the dry oxide process has a controllable oxidation thickness of approximately 1 nm to approximately 15 nm.

6. The method of claim 1, wherein the dry oxide process is performed in a plasma oxidation chamber.

7. The method of claim 1, wherein the dry oxide process is performed at a temperature of less than approximately 450 degrees Celsius.

8. The method of claim 1, wherein the passivation layer is doped with boron, gallium, phosphor, or arsenic.

9. The method of claim 1, wherein the oxide layer has at least a 95% conformality on all surfaces of the trench for high aspect ratios of greater than approximately 100:1.

10. The method of claim 1, wherein an interface between the passivation region and the substrate material allows photon passage without refraction.

11. A method of forming a trench structure in a substrate, comprising:
    etching a trench with a high aspect ratio into a substrate material, wherein the trench has a high aspect ratio of greater than approximately 75:1;
    repairing surfaces of the trench from damage caused by etching of the trench;
    growing an epitaxial layer on surfaces of the trench to form a homogeneous passivation region as part of the substrate material;
    doping the epitaxial layer with an additional dopant to engineer a passivation charge region; and
    performing a charge diffusion process to embed the additional dopant into the substrate material.

12. The method of claim 11, wherein the homogeneous passivation region is formed by single crystal epitaxial growth or by oxidizing non-crystal doped material.

13. The method of claim 11, further comprising:
    etching the trench to the high aspect ratio greater than approximately 75:1.

14. The method of claim 11, further comprising:
    repairing surfaces of the deep trench by:
    forming a dry oxide layer on surfaces of the trench; and
    selectively removing the dry oxide layer from surfaces of the trench, wherein selectively removing the oxide layer is accomplished with a selectivity of oxide to the substrate material of greater than 50:1.

15. The method of claim 14, wherein forming the dry oxide layer is a process with a controllable oxidation thickness of approximately 1 nm to approximately 15 nm.

16. The method of claim 14, wherein the dry oxide layer is formed in a plasma oxidation chamber.

17. The method of claim 14, wherein the dry oxide layer has at least a 95% conformality on surfaces of the trench for high aspect ratios of greater than approximately 100:1.

18. The method of claim 14, wherein the epitaxial layer is doped with boron, gallium, phosphor, or arsenic.

19. A non-transitory, computer readable medium having instructions stored thereon that, when executed, cause a method for forming a trench structure in a substrate to be performed, the method comprising:
    etching a trench into a substrate material of the substrate, wherein the trench has a high aspect ratio of greater than approximately 75:1;
    forming an oxide layer on surfaces of the trench using a dry oxide process;

selectively removing the oxide layer from surfaces of the trench, wherein selectively removing the oxide layer is accomplished with a selectivity of oxide to the substrate material of greater than 50:1; and forming a passivation layer on surfaces of the trench to form a homogeneous passivation region as part of the substrate material.

20. The non-transitory, computer readable medium of claim 19, wherein the oxide layer has at least a 95% conformality on all surfaces of the trench for high aspect ratios of greater than approximately 100:1.

* * * * *